United States Patent
Niidome et al.

(10) Patent No.: US 7,691,176 B2
(45) Date of Patent: Apr. 6, 2010

(54) METHOD FOR MANUFACTURING METAL NANORODS AND USES THEREOF

(75) Inventors: Yasuro Niidome, 4-12-1215, Hakozaki 5-chome, Higashi-ku, Fukuoka-shi, Fukuoka-ken (JP); Sunao Yamada, Kasuya-gun (JP); Koji Nishioka, Fukuoka (JP); Hideya Kawasaki, Fukuoka (JP); Hiroki Hirata, Naka (JP); Yoshiaki Takata, Naka (JP); Jun-etsu Satoh, Naka (JP); Daigou Mizoguchi, Hitachinaka (JP); Masaoki Ishihara, Otawara (JP); Masanori Nagai, Otawara (JP); Masato Murouchi, Otawara (JP)

(73) Assignees: Yasuro Niidome, Fukuoka-ken (JP); Mitsubishi Materials Corporation, Tokyo (JP); Dai Nippon Toryo Co., Ltd., Osaka (JP)

( * ) Notice: Subject to any disclaimer, the term of this patent is extended or adjusted under 35 U.S.C. 154(b) by 420 days.

(21) Appl. No.: 10/556,498

(22) PCT Filed: May 13, 2004

(86) PCT No.: PCT/JP2004/006804

§ 371 (c)(1),
(2), (4) Date: Jan. 30, 2006

(87) PCT Pub. No.: WO2004/101430

PCT Pub. Date: Nov. 25, 2004

(65) Prior Publication Data

US 2006/0196309 A1     Sep. 7, 2006

(30) Foreign Application Priority Data

| May 13, 2003 | (JP) | ................... 2003-135062 |
| Sep. 5, 2003 | (JP) | ................... 2003-314203 |
| Jan. 30, 2004 | (JP) | ................... 2004-024006 |

(51) Int. Cl.
  B22F 9/22 (2006.01)
  B01J 13/00 (2006.01)
  B82B 3/00 (2006.01)
(52) U.S. Cl. .................. 75/345; 75/371; 977/762; 977/896
(58) Field of Classification Search .................. 75/255, 75/345, 371; 977/762, 896
  See application file for complete search history.

(56) References Cited

FOREIGN PATENT DOCUMENTS

| CN | 1127177 | 7/1996 |
| JP | 62-61630 A | 3/1987 |
| JP | 11-290674 A | 10/1999 |
| JP | 2000-72951 A | 3/2000 |

OTHER PUBLICATIONS

N.R. Jana et al. Wet chemical synthesis of high aspect ratio cylindrical gold nanorods, Journal of Physical Chemistry, vol. 105, No. 19, p. 4065-4067, May 17, 2001.—in Applicant's IDS.*

(Continued)

*Primary Examiner*—George Wyszomierski
*Assistant Examiner*—Mark L Shevin
(74) *Attorney, Agent, or Firm*—Darby & Darby P.C.

(57) ABSTRACT

A method for manufacturing metal nanorods includes: a step of adding a reducing agent to a metallic salt solution; a step of radiating light into the metallic salt solution containing the reducing agent; and a step of leaving the light-radiated metallic salt solution containing the reducing agent stationary in a dark place so as to grow metal nanorods. Metal nanorods can be also grown by forming a mixed solution by fractionating the above light-radiated metallic salt solution and mixing the fractionated metallic salt solution into a non-radiated metallic salt solution containing the reducing agent, or mixing a non-radiated metallic salt solution and the reducing agent into the above light-radiated metallic salt solution; and leaving the mixed solution stationary in a dark place so as to grow metal nanorods.

12 Claims, 9 Drawing Sheets

N.R. Jana et al, Wet chemical synthesis of high aspect ratio cylindrical gold nanorods, J. Phys. Chem. B, (2001) vol. 105, p. 4065-4067.*

N.R. Jana et al, Seed-mediated growth approached for shape-controlled synthesis of spheroidal and rod-like gold nanoparticles using a surfactant template. (2001) vol. 13, No. 18, p. 1389-1393.*

F. Kim et al, Photochemical synthesis of gold nanorods, J. Am. Chem. Soc., (2002), vol. 124, p. 14316-14317.*

Y. Sun and Y. Xiam, Gold and silver nanoparticles: a class of chromophores with colors tunable in the range from 400 to 750 nm, Analyst, 2003, vol. 128, p. 686-691.*

Wang, C. et al. "A Novel Soft-Template Technique to Synthesize Metal AG Nanowire." Journal of Colloid and Interface Science. vol. 243, No. 2, p. 362-364 (2001). XP002477703.

Niidome, Y. et al. "Rapid Synthesis of Gold Nanorods by the Combination of Chemical Reduction and Photoirradiation Processes; Morphological Changes Depending on the Growing Processes." Chemical Communications (Cambridge, England) No. 18, pp. 2376-2377 (2003). XP002477704.

Liu, F-K. et al. "Microwave Rapid Heating for the Synthesis of Gold Nanorods." Materials Letters, North Holland Publishing Company. Amsterdam, NL vol. 58, No. 3-4, pp. 373-377 (2004). XP004475674.

International Search Report for PCT/JP2004/006804 dated Aug. 24, 2004.

"Wet Chemical Synthesis or High Aspect Ratio Cylindrical Gold Nanorods" by Jana et al., The Journal of Physical Chemistry, The American Chemical Society, May 17, 2001, vol. 105, No. 19, pp. 4065-4067.

"Photochemical Synthesis of Gold Nanorods" by Kim et al., Journal of the American Chemical Society, American Chemical Society, Dec. 4, 2002, vol. 124, No. 48, pp. 14316-14317.

"Gold Nanorods: Electrochemical Synthesis and Optical Properties" by Chang, et al. In "The Journal of Physical Chemistry B", vol. 101, No. 34, Aug. 21, 1997, pp. 6661-6665.

* cited by examiner

US 7,691,176 B2

METHOD FOR MANUFACTURING METAL NANORODS AND USES THEREOF

CROSS-REFERENCE TO PRIOR APPLICATION

This is a U.S. national phase application under 35 U.S.C. §371 of International Patent Application No. PCT/JP2004/006804 filed May 13, 2004, and claims the benefit of Japanese Patent Application Nos. 2003-135062 filed May 13, 2003; 2003-314203 filed Sep. 5, 2003 and 2004-24006 filed Jan. 30, 2004, all of which are incorporated by reference herein. The International Application was published in Japanese on Nov. 25, 2004 as WO 2004/101430 A1 under PCT Article 21(2).

TECHNICAL FIELD

The present invention relates to a method for manufacturing metal nanorods that excel in optical absorption properties in a region extending from visible light to near infrared rays and a use thereof. The present invention particularly relates to technology for suppressing a generation of spherical metal nano-particles and technology for controlling a configuration of the metal nanorod so as to design its spectral characteristics.

BACKGROUND ART

Gold nano-particles in a shape of a rod (gold nanorods) with uniform configuration have a strong absorption band in a region extending from visible light to near infrared rays, and it is possible to change its absorption peak positions easily by controlling configuration thereof. Gold nanorods have high aptitude as near-infrared probes because modification of their surface enables change of their physical properties.

As methods for manufacturing gold nanorods, an electrolytic method, a chemical reduction method and a photo-reduction method are conventionally known. With the electrolytic method (reference is made to Non-Patent Reference 1: Y. Y. Yu, S. S. Chang, C. L. Lee and C. R. C. Wang, J. Phys. Chem. B, 101, 6661 (1997)), a solution containing a cationic surfactant is electrolyzed by constant current, and gold clusters are leached from a gold plate at the anode, thereby generating gold nanorods. For the above-mentioned surfactant, a quaternary ammonium salt having a structure in which four hydrophobic substituents are bonded to a nitrogen atom is used.

In addition, a compound in which an autonomous molecular assembly is not formed, for example, tetradodecylammonium bromide (TDAB), is added. In the case of manufacturing the gold nanorods, the source of the gold supply is gold clusters that are leached from a gold plate at the anode, and gold salt, such as chlorauric acid, is not used. Ultrasonic waves are radiated during electrolysis, a silver plate is immersed in the solution, and the growth of the gold nanorods is accelerated.

The electrolytic method is characterized by the fact that the change of the area of the silver plate to be immersed separately from an electrode enables control of the length of the rod to be generated. The adjustment of the rod length enables setting of the absorption band in the near-infrared region from the vicinity of 700 nm to the vicinity of 1,200 nm. If the reaction condition is uniformly maintained, gold nanorods with a uniform configuration can be manufactured to an extent. However, the surfactant solution used for the electrolysis is a complex system containing excessive quaternary ammonium salt, cyclohexane and acetone, and because of indefinite elements, such as ultrasound wave radiation, it is difficult to theoretically analyze a cause-effect relationship between the configuration of the gold nanorods to be generated and various manufacturing conditions, and to optimize the manufacturing conditions for the gold nanorods. Furthermore, because of the nature of the electrolysis, it is not easy to scale up, making it unsuitable for the large-scale manufacture of gold nanorods.

With the chemical reduction method (reference is made to Non-Patent Reference 2: N. R. Jana, L. Gearheart and C. J. Murphy, J. Phys. Chem. B, 105, 4065 (2001)), $NaBH_4$ reduces chlorauric acid and gold nano-particles are generated. Considering these gold nano-particles as "seed particles" and growing them in the solution results in obtaining the gold nanorods. The length of the gold nanorods to be generated is determined according to the quantitative ratio of the "seed particles" to the chlorauric acid added to the growth solution. With the chemical reduction method, it is possible to generate longer gold nanorods in comparison with the above-described electrolytic method. A gold nanorod having an absorption peak in the near-infrared region over 1,200 nm is reported.

As described above, in the chemical reduction method, two reaction baths for the preparation and reaction to grow the "seed particles" are required. Furthermore, although the generation of the "seed particles" is completed in several minutes, it is difficult to increase the concentration of the gold nanorods generated, and the generation concentration of the gold nanorods is one-tenth or less in comparison with that when using the electrolytic method.

With the photo-reduction method (reference is made to Non-Patent Reference 3: F. Kim, J. H. Song and P. Yang, J. Am. Chem. Soc., 124, 14316 (2002)), chlorauric acid is added to substantially the same solution as that in the electrolytic method, and ultraviolet irradiation results in the reduction of the chlorauric acid. For irradiation, a low-pressure mercury lamp is used. In the photo-reduction method, gold nanorods can be generated without producing seed particles. It is possible to control the length of the gold nanorods by the irradiation time. This method is characterized by excellently uniform configuration of the gold nanorods generated. With the electrolytic method, because a large quantity of spherical particles coexist after reaction, it is necessary to separate the spherical particles by centrifuging. However, with the photo-reduction method, since the ratio of the spherical particles is small, separation processing is unnecessary. Furthermore, there are advantages, for example, in that reproducibility is excellent, and gold nanorods of the same size can be almost certainly obtained using a standard operation.

In the meantime, the photo-reduction method requires 10 hours or more for the reaction. Furthermore, particles having an absorption peak at a position of over 800 nm cannot be obtained. In addition, there is the additional problem in that light from the low-pressure mercury lamp is harmful to the human body.

The present invention has resolved the above-mentioned problems in the manufacturing methods requiring several hours for the conventional manufacture of metal nanorods, and provides a method to enable the prompt and simple manufacturing of metal nanorods, such as of gold, silver or copper. Furthermore, the present invention provides a metal nanorod manufacturing method where the generation ratio of spherical metal nano-particles, intermixed as by-products, is reduced and no purification process after the reaction is required. In addition, the present invention provides a manufacturing method where the configuration control of the metal nanorods in a wide range enables control of the spectral characteristic in the region extending from visible light to near infrared rays. Furthermore, the present invention provides for the use of the manufactured metal nanorods.

DISCLOSURE OF THE INVENTION

For example, in the case of gold, in the photo-reduction method, an orange-colored (originating from chlorauric acid) solution at a beginning of the reaction becomes clear at first, and then, the color changes to violet, and further changes to blue. Concerning a time period required for the reaction, the period for becoming clear is the longest, and the period from clear to violet is short. If a very slow first photo-reaction process (the process in which the solution becomes clear) which is a rate-determining step for the entire process of manufacturing metal nanorods by the photo-reduction method, can progress in a short time, the time period required for manufacturing metal nanorods can be drastically shortened.

In contrast, when a chemical reducing agent is added to a solution in a same state as that in the photo-reduction method, the color of the solution immediately changes to become clear; however this chemical reduction does not cause a prompt generation of gold nano-particles having plasmon absorption. However, by combining this chemical reduction with the photo-reaction process and substituting the first reduction process in which the reaction is extremely slow in the photo-reduction method, for the chemical reduction, significant acceleration of manufacturing gold nanorods can be realized.

In the present invention, considering the above-mentioned circumstances, a chemical reduction process of a metallic salt solution is employed as a first stage, and a process to radiate light into the chemically reduced metallic salt solution is employed as a second stage. By employing both of the processes, it is possible to manufacture the metal nanorod in a short time. In addition, the time period for the light irradiation into the metallic salt solution containing the reducing agent is shortened and a process to accelerate a growth of the metal nanorods by leaving the metallic salt solution stationary in a dark place is employed as a third stage. Thereby, it is possible to manufacture metal nanorods having target wavelength absorption characteristics efficiently.

According to the present invention, methods for manufacturing metal nanorods including the following features can be provided.

(1) A method for manufacturing metal nanorods includes: a step of chemically reducing a metallic salt in a solution using a reducing agent; and a step of radiating light into the solution in which the metallic salt is chemically reduced so as to generate metal nano-particles in a shape of a rod (referred to as metal nanorods).

(2) A method for manufacturing metal nanorods includes: a step of adding a reducing agent to a metallic salt solution; a step of radiating light into the metallic salt solution containing the reducing agent; and a step of leaving the light-radiated metallic salt solution containing the reducing agent stationary in a dark place so as to grow metal nanorods.

(3) A method for manufacturing metal nanorods includes: a step of adding a reducing agent to a metallic salt solution; a step of radiating light into the metallic salt solution containing the reducing agent; a step of fractionating the light-radiated metallic salt solution and mixing the fractionated metallic salt solution into a non-radiated metallic salt solution containing the reducing agent; and a step of leaving the mixed solution stationary in a dark place so as to grow metal nanorods.

(4) A method for manufacturing metal nanorods includes: a step of adding a reducing agent to a metallic salt solution; a step of radiating light into the metallic salt solution containing the reducing agent; a step of mixing a non-radiated metallic salt solution and the reducing agent into the light-radiated metallic salt solution; and a step of leaving the mixed solution stationary in a dark place so as to grow metal nanorods.

(5) The method for manufacturing metal nanorods according to any one of the above (1) to (4), wherein a metallic salt solution containing a surfactant along with the reducing agent is used and light is radiated into the metallic salt solution.

(6) The method for manufacturing metal nanorods according to the above (3), wherein light is radiated into a metallic salt solution containing a surfactant along with the reducing agent; a small quantity of the light-radiated solution is fractionated to use as a seed solution; and the seed solution is mixed into a non-radiated metallic salt solution containing the reducing agent in which a concentration of the surfactant is high and the solution is left stationary in a dark place, thereby metal nanorods are manufactured which have a larger aspect ratio than that of metal nanorods contained in the seed solution.

(7) The method for manufacturing metal nanorods according to the above (4), wherein a metallic salt solution containing a surfactant along with the reducing agent is used; light is radiated into the metallic salt solution; a non-radiated metallic salt solution not containing a surfactant and the reducing agent are mixed into the light-radiated metallic salt solution; and the mixed solution is left stationary in a dark place so as to grow metal nanorods.

(8) The method for manufacturing metal nanorods according to any one of the above (1) to (7), wherein ascorbic acid, citric acid or its salt, hydroxylamine hydrochloride, a hydrazine compound, succinic acid or its salt, or amines is used as the reducing agent.

(9) The method for manufacturing metal nanorods according to any one of the above (5) to (8), wherein a quaternary ammonium salt expressed by the following expression [I] is used as the surfactant.

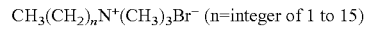

$$CH_3(CH_2)_nN^+(CH_3)_3Br^- \quad (n=\text{integer of 1 to 15}) \quad [I]$$

(10) The method for manufacturing metal nanorods according to any one of the above (1) to (9), wherein light is radiated into the metallic salt solution in a presence of a substance which accelerates a major axis growth of the metal nanorods.

(11) The method for manufacturing metal nanorods according to the above (10), wherein at least one of a quaternary ammonium salt expressed by the following expression [II], an anionic surfactant and silver salt is used as the substance which accelerates the major axis growth of the metal nanorods.

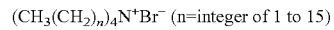

$$(CH_3(CH_2)_n)_4N^+Br^- \quad (n=\text{integer of 1 to 15}) \quad [II]$$

(12) The method for manufacturing metal nanorods according to any one of the above (1) to (11), wherein a metallic salt solution to which ketones are added is used.

(13) The method for manufacturing metal nanorods according to any one of the above (1) to (12), wherein a metallic salt solution to which a chain hydrocarbon or a ring hydrocarbon is added is used.

(14) The method for manufacturing metal nanorods according to any one of the above (5) to (13), wherein a configuration of the metal nanorods is controlled by adjusting at least any one of types of the surfactant, added amount of the surfactant, added amount of the substance which accelerates the major axis growth of the metal nanorods, light irradiation intensity and light irradiation time.
(15) The method for manufacturing metal nanorods according to any one of the above (1) to (14), wherein in the step of radiating light, ultraviolet rays having a wavelength of less than 315 nm are radiated.
(16) The method for manufacturing metal nanorods according to any one of the above (1) to (15), wherein a reaction container having an optical path length of 1 cm or less is used to control the configuration of the generating metal nanorods to be uniform.
(17) The method for manufacturing metal nanorods according to any one of the above (1) to (16), wherein dissolved oxygen is removed in a reaction solution so as to accelerate photo-reaction.
(18) The manufacturing method according to any one of the above (1) to (17), wherein the metal nanorods are either of gold nanorods, silver nanorods or copper nanorods.

Also, according to the present invention, the following usages which include metal nanorods manufactured using the method of the present invention can be provided.
(19) A coating composition, a coating or a film which includes the metal nanorods manufactured using the method according to any one of the above (1) to (18).
(20) A wiring material, an electrode material, a catalyst, a colorant, a cosmetic, a near-infrared absorber, anti-counterfeit ink, an electromagnetic shielding material, a surface enhanced fluorescent sensor, a biomarker or a nano-waveguide which includes the metal nanorods manufactured using the method according to any one of the above (1) to (18).

According to the manufacturing method of the present invention, metal nanorods can be quickly and easily manufactured. Furthermore, in the manufacturing method of the present invention, a ratio of a generation of spherical metal nano-particles which are by-products is small; therefore, fractionation and purification after reaction are not required. In addition, configuration control of the metal nanorods is easy; therefore metal nanorods of which spectral characteristics are controlled in a wide wavelength region from the visible light to the near infrared ray can be obtained.

Furthermore, in conventional methods, in any cases, the above-mentioned compound (II) is used for the configuration control of the metal nanorods. In contrast, according to the manufacturing method of the present invention, even if a solution not containing this compound (II) is used, the metal nanorods can be manufactured; in addition, a coexistence of silver salt enables configuration control of the metal nanorods. Also, in the manufacturing method of the present invention, the removal of dissolved oxygen from the reaction solution enables the acceleration of the reaction of metal nanorod generation.

In addition, according to the manufacturing method of the present invention, a small quantity of the light-radiated raw material solution is used as a seed solution, and this seed solution is mixed into a non-radiated raw material solution; thereby the metal nanorods can be grown. Therefore, a large quantity of metal nanorods can be manufactured efficiently without setting up a facility to radiate light into a large quantity of raw material solution.

Furthermore, by mixing a light-radiated raw material solution with a non-radiated raw material solution, the metal nanorods can be grown. Therefore, a large quantity of metal nanorods can be manufactured from the beginning without using a solution of which the metallic salt concentration is high. Also, in this method, since a surfactant does not have to be added to the non-radiated raw material solution, the quantity of the surfactant to be used can be drastically reduced. As described above, any of the above-mentioned methods is suitable for industrial manufacturing.

BEST MODE FOR CARRYING OUT THE INVENTION

Figure 1:
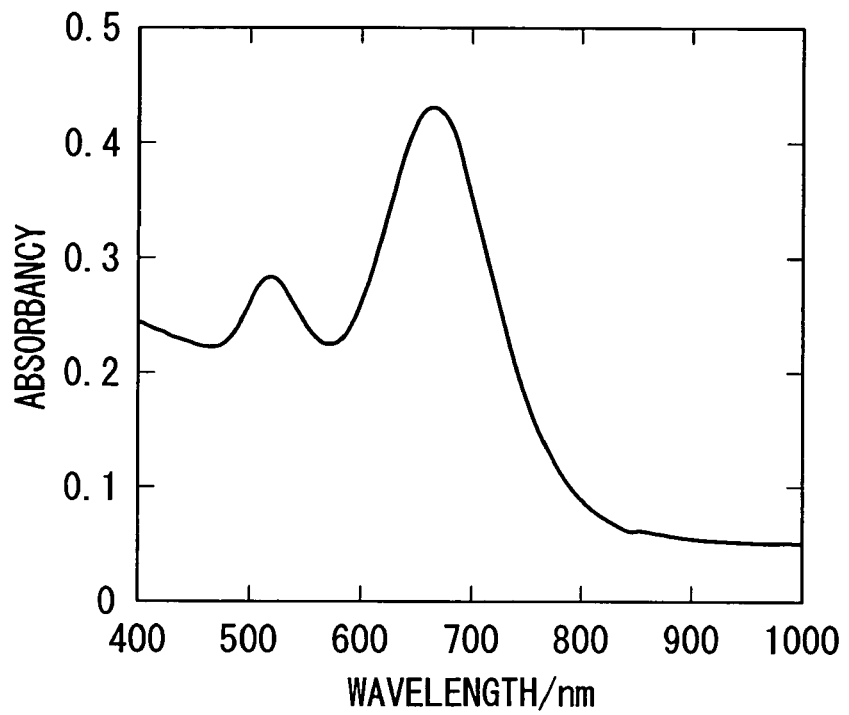
FIG. 1 is an absorption spectrum chart after light irradiation in Embodiment 1.

A method for manufacturing metal nanorods according to the present invention includes a step of chemically reducing a metallic salt in a solution, and a step of radiating light into the solution in which the metallic salt has been chemically reduced so as to generate metal nano-particles in a shape of rod (metal nanorods). Specifically, for example, the method includes a step of adding a reducing agent to a metallic salt solution, a step of radiating light into the metallic salt solution containing the reducing agent, and a step of stationarily leaving the light-radiated metallic salt solution containing the reducing agent stationary in a dark place so as to grow metal nanorods.

The manufacturing method of the present invention is specifically described hereafter by referring to an embodiment of manufacturing gold nanorods. Here, methods for manufacturing other metal, such as silver nanorods, are basically similar, as shown in the below-mentioned embodiments.

In order to synthesize gold nanorods using the manufacturing method of the present invention, a solution containing soluble gold salt is used as a synthesis solution. Specifically, for example, a solution containing a gold complex compound, which can be easily handled, is preferable, and a gold halide solution or a gold cyanide solution, which is easily prepared, is more preferable. For a gold salt concentration in the synthesis solution, a range of 0.5 mM to 20 mM is appropriate, and a range of 1 mM to 5 mM is more preferable.

It is preferable that a surfactant be added to the above-mentioned gold salt solution. This surfactant functions to cause gold to have a rod-shaped molecular assembly structure, and for example, as shown in the following expression [I], the surfactant is a quaternary ammonium salt having a structure in which three methyl groups and an alkyl group having a length of one ethyl group or longer are bonded to nitrogen atom (hereinafter, referred to as surfactant (compound I)). Specifically, for example, hexadecyltrimethylammonium bromide (CTAB) can be used. For a concentration of this surfactant (compound I), a range of 20 mM to 1 M is appropriate. If this concentration is too low, dispersion stability of the gold nanorods is insufficient, and aggregations are easily formed. Furthermore, if the concentration is too high, a viscosity of the synthesis solution becomes higher, and handling tends to be difficult.

$$CH_3(CH_2)_n N^+(CH_3)_3 Br^- \quad \text{(n=integer of 1 to 15)} \quad [I]$$

In addition, it is preferable to add a hydrocarbon for stabilizing the rod-shaped molecular assembly structure to the gold salt solution, because the reaction for generating the gold nanorods becomes stable. This hydrocarbon has effects of suppressing a generation of spherical gold colloids and adjusting an aspect ratio. The hydrocarbon can be either a chain compound or a ring compound, among which cyclohexane is preferable. For an addition amount of the hydrocarbon, 5% by weight or less of the synthesis solution is appropriate, and a range of 0.01% to 3% by weight is preferable. If this addition amount is too low, a generation ratio of the spherical gold colloids tends to increase, and if the addition amount is too great, the aspect ratio of the gold nanorods becomes small and the generation tends to drastically decrease.

Furthermore, by adding a compound which is involved in the oxidation-reduction, for example, a small quantity of ketones, to the gold salt solution, the reaction for generating the gold nanorods also becomes stable. The ketones have effects of accelerating a generation rate of the gold nanorods due to a light irradiation, and it is better to add the compound before the light irradiation. Among the ketones, acetone is especially preferable, and for an addition amount, 10% by weight or less of the synthesis solution is appropriate, and 1 to 3% by weight of the synthesis solution is preferable. If the addition amount is too low, generation amount of the gold nanorods tends to decrease, and if the addition amount is too great, the generation ratio of the spherical gold colloids increases and the generation amount of the gold nanorods tends to drastically decrease.

A reducing agent is added to the gold salt solution so as to reduce the gold salt. It is preferable to add the reducing agent to a gold salt solution containing a surfactant so as to reduce the gold salt. For the reducing agent, a reducing agent of which the generation ratio of gold clusters (growth nucleus of the nano particles) is low is preferable. For example, ascorbic acid, citric acid or its salt, hydroxylamine hydrochloride, a hydrazine compound, succinic acid or its salt, or amines (butylamine, trimethylamine or ethanolamine) can be used. The reducing agent of which an addition amount is sufficient to reduce the gold salt is added to the gold salt solution, thereby reducing the gold salt. For example, 50 to 200 parts by weight of an ascorbic acid solution having a concentration of 40 mM can be added to 100 parts by weight of a chlorauric acid solution having a concentration of 24 mM, and the amount of the ascorbic acid solution is preferably 80 to 120 parts by weight. Excessive amount of the reducing agent tends to induce the generation of spherical particles. Furthermore, alkali metal borohydride salt, such as sodium borohydride, tends to increase an efficiency to generate the spherical particles.

After adding the reducing agent to the gold salt solution, preferably the gold salt solution containing the surfactant, light is radiated into the gold salt solution so as to generate the gold nanorods. It is preferable to perform the light irradiation in a presence of a substance for inducing a phenomenon in which a growth reaction of the gold particles selectively occurs at a particular crystal plane, that is, a substance for accelerating a major axis growth of the gold nanorods. As this substance for accelerating the major axis growth of the gold nanorods, a quaternary ammonium salt in which equivalent alkyl groups are bonded to a nitrogen atom (hereinafter referred to as compound II), an anionic surfactant or a silver salt can be used. Among these, the silver salt is preferable, and examples of the silver salt include silver nitrate, silver chloride and silver bromide. The silver salt is the most effective to increase the aspect ratio of the gold nanorods. It is better to add this substance to the gold salt solution along with the surfactant (compound I) and cyclohexane in advance. Here, a specific example of the above-mentioned compound II is tetradecyl ammonium bromide (TDAB).

$$(CH_3(CH_2)_n)_4 N^+ Br^- \quad \text{(n=integer of 1 to 15)} \quad [II]$$

As mentioned above, in the manufacturing method of the present invention, as a synthesis solution of the gold nanorods, any one of the followings can be used: (a) a gold salt solution containing a surfactant (compound I), such as CTAB; (b) a gold salt solution containing compound II, such as TDAB, along with a surfactant (compound I), such as CTAB; (c) a gold salt solution containing an anionic surfactant along with a surfactant (compound I), such as CTAB; and (d) a gold salt solution containing silver salt along with a surfactant (compound I), such as CTAB. Here, as described above, it is preferable to contain a hydrocarbon, such as cyclohexane, or a small quantity of ketones in each of these gold salt solutions.

By adjusting an addition amount of this surfactant (compound I) and an addition amount of the substance for accelerating the major axis growth of the gold nanorods, it is possible to control a configuration of the gold nanorods to be generated, consequently absorption spectrum characteristics can be controlled. Peaks of the absorption spectrum can be controlled within a range of 600 nm to 1,500 nm. Here, for a silver salt concentration to be added, a range of 1 μM to 1 mM is effective, and the higher the silver salt concentration, the longer the major axis length of the gold nanorods which can be obtained. The excessive addition of the silver salt tends to reduce the reaction rate.

Light irradiation intensity, light irradiation time and irradiation wavelength can also determine the generation and the configuration of the gold nanorods. For the light to be radiated, ultraviolet rays having a wavelength of less than 315 nm, preferably ultraviolet rays having a wavelength of 310 nm or less are effective. Gold nanorods are manufacturable even using a low pressure mercury lamp, but the gold nanorods can be effectively generated using a light having a wavelength of less than 315 nm emitted from an extra-high pressure mercury lamp, a high pressure mercury lamp or a xenon lamp. Specifically, for example, when a light emitted from the high pressure mercury lamp with an illumination intensity of 10 mW/cm$^2$ or less is radiated into the above-mentioned solution, the gold nanorods are generated by the ultraviolet rays included in the emitted light.

Concerning the light irradiation time, for example, if the light irradiation time is within an initial given time (approximately 6 minutes in Embodiment 7), mainly the major axis grows. Here, in the case in which light is radiated from a side of a reaction container, by using a reaction container in which an optical path length of a cell is 1 cm or less, and more preferably 1 mm, the photo reaction proceeds uniformly, thereby a size of the gold nanorods becomes uniform. In contrast, in the case in which light is directly radiated into a solution from an upper side of the reaction container, the optical path length of the cell is not limited.

For the light irradiation time, for example, light emitted from the high pressure mercury lamp with an illumination intensity of 10 mW/cm$^2$ or less may be directly radiated into a solution from the upper side of the reaction container for approximately 5 minutes. After the light irradiation, the solution may be left stationary as it is or agitated and then left stationary, in a dark place in which the radiated light is cut off for a predetermined period of time. Nucleus of the gold nanorods are formed by the light irradiation. By leaving the solution stationary as it is or agitating the solution and then leaving stationary, in a dark place in which the radiated light is cut off for a predetermined period of time, the nucleus grow, and consequently for example, gold nanorods having an aspect ratio of 1.5 to 8.0 can be obtained. Incidentally, since the aspect ratio depends upon the irradiation time, in order for controlling the aspect ratio, the light irradiation time should be adjusted, and after the light irradiation, the nucleus of the gold nanorods should be grown in the dark place in which the irradiating light is cut off.

A gas dissolved in the reaction solution, especially oxygen, greatly affects a process of generating the gold nanorods. When the reaction solution is bubbled with oxygen, the generation reaction of the gold nanorods due to the light irradiation is strongly suppressed. In contrast, when the dissolved oxygen is removed by bubbling nitrogen into the reaction solution, it is possible to accelerate the generation reaction of the gold nanorods.

In the above-mentioned manufacturing method, in the case in which the light-radiated solution is left stationary in the dark place after the light irradiation process so as to accelerate the growth of the gold nanorods, the metallic salt solution containing the reducing agent is divided into multiple solutions, and light is radiated into some of the metallic salt solutions containing the reducing agent, and then a small quantity of the light-radiated solutions is fractionated to use as a seed solution. The seed solution is mixed into the remaining non-radiated metallic salt solution containing the reducing agent, and the mixed solution is left stationary in a dark place. Thereby, the gold nanorods can also be grown. For the quantity to be fractionated, for example, 5% by weight is appropriate relative to the non-radiated metallic salt solution containing the reducing agent.

According to this method, in the case of manufacturing a large quantity of metal nanorods, there is no need for establishing a facility to radiate light into a large quantity of a raw material solution. For example, many metallic salt solutions containing the reducing agent are prepared in advance, and light is radiated into a portion of the solutions, and then many seed solutions are fractionated from the light-radiated solution. This seed solution is mixed into non-radiated metallic salt solutions containing the reducing agent (mother solution) and the solutions are left stationary in a dark place. Thereby, it is possible to manufacture many metal nanorods efficiently.

In addition, in this method using the seed solution, in the case of using the metallic salt solution containing a surfactant along with a reducing agent, when the seed solution fractionated from the light-radiated solution is mixed into the non-radiated metallic salt solution containing the reducing agent (mother solution) of which a surfactant concentration is high and the solution is left stationary in a dark place, it is possible to manufacture metal nanorods having a larger aspect ratio than that of metal nanorods contained in the seed solution. According to this method, by adjusting the surfactant concentration in the mother solution separately from that in the seed solution, the aspect ratio of the metal nanorods can be controlled.

Furthermore, in the above-mentioned manufacturing method, instead of a method in which a small quantity of the light-radiated metallic salt solution containing the reducing agent is fractionated and used as the seed solution, a non-radiated metallic salt solution and a reducing agent solution are mixed into a light-radiated metallic solution containing the reducing agent, and the mixed solution is left stationary in a dark place. Thereby, the metal nanorods can also be grown. Here, it is preferable to simultaneously deliver the non-radiated metallic salt solution and the reducing agent solution by drops into the light-radiated metallic salt solution containing the reducing agent little by little.

According to this method, in the case of manufacturing a large quantity of metal nanorods, a generation ratio of the rod-shaped metal nano-particles can be increased without from the beginning, using a solution having a high concentration of metallic salt. In general, in the case of manufacturing the metal nanorods by radiating light into a metallic salt solution to which the reducing agent is added, if the metallic salt concentration is high, the generation ratio of the spherical particles tends to increase. However, according to the above-mentioned manufacturing method of the present invention, by using a solution of which the metallic salt concentration is comparatively low, the generation of the spherical particles can be suppressed, and by mixing the non-radiated metallic salt solution into the light-radiated metallic salt solution so as to double the solution quantity, a large quantity of rod-shaped particles can be manufactured efficiently.

Furthermore, in this method in which the light-radiated solution and the non-radiated solution are mixed, light is radiated into a metallic salt solution containing a surfactant along with the reducing agent. Meanwhile, as the metallic salt solution mixed into the light-radiated metallic salt solution, a solution not containing a surfactant can be used.

Metal nanorods manufactured by the above-mentioned method of the present invention are suitable for materials for a coating composition, a coating, a film, a wiring material, an electrode material, a catalyst, a colorant, a cosmetic, a near-infrared absorber, an anti-counterfeit ink and an electromagnetic shielding material. In addition, the metal nanorods of the present invention can be used for materials for a surface enhanced fluorescent sensor, a biomarker and a nano-waveguide.

Specifically, a solution in which the metal nanorods of the present invention are dispersed can be used for a material of the anti-counterfeit ink. For the anti-counterfeit ink, a characteristic of absorbing specific wavelengths, a scattering light or a fluorescence of the metal nanorods is used for a detection method. For example, since the gold nanorods have a characteristic of absorbing specific wavelengths in a wavelength region of 600 nm to 1,500 nm, a detection wavelength is set to this range. By setting the specific absorption wavelength in the near-infrared region of 760 nm to 1,500 nm, an invisible ink can be obtained which is transparent in a visible light region. Since the invisible ink is identifiable in the near-infrared region, it can be use as the anti-counterfeit ink. By using the metal nanorods in this ink, a film coated with the ink is excellent in weather resistance, heat resistance and chemical resistance. Furthermore, for a dispersant used for a surface treatment of the metal nanorods, a dispersant compatible with a solvent to be used can be selected. Therefore, the solvent of the anti-counterfeit ink can be appropriately selected.

Also, the metal nanorods of the present invention can be used as a colorant for a cosmetic. When the metal nanorods of the present invention are dispersed in an oil-based base material, it is difficult to be recognized as particles with naked eyes, thereby, a coating having high transparency can be obtained. Furthermore, by adding a small quantity of the metal nanorods of the present invention to the cosmetic, a strong tinting strength and a high color saturation can be realized.

In addition, a conductive paste in which metal nanorods are used as a conductive material can be used for a wiring material or an electrode material. This conductive paste is applied onto an insulating base material by printing and is dried (baked). Thereby, the wiring or the electrode is formed which is excellent in conductivity and migration resistance. For this conductive paste, for example, a paste containing 1 to 20 parts by weight of a binder relative to 100 parts by weight of the metal nanorods is used.

It is known that by securing the metal nano-particles on the surface of the glass substrate at high density, a phenomenon of absorbing infrared rays or emitting fluorescence are enhanced. The spectroscopy using this phenomenon is referred to as Surface Enhanced IR Spectroscopy (SEIRS) and Surface Enhanced Fluorescence Spectroscopy (SEFS), respectively. Between them, it is said that SEFS excels in simplicity. The metal nanorods of the present invention are suitable for a sensor material based upon the Surface Enhanced IR Spectroscopy and the Surface Enhanced Fluorescence Spectroscopy. For example, since the gold nanorods has an absorption region with small absorbance in a wavelength region from 550 nm to 800 nm, a sensor material formed by securing gold nanorods treated with a silane agent having a thiol end (such as, 3-mercaptopropyltrimethylsilane) on a glass substrate at high density is suitable for an SEFS spectroscopy sensor for which a fluorescent substance (for example, rhodamine series fluorescent pigments) emitting fluorescence in that wavelength region is used as a marker.

In addition, the metal nanorods of the present invention can be used as a biomarker responding to near infrared rays. For example, near infrared rays with 750 nm to 1,100 nm wavelength are not substantially absorbed by organic substances. However, the gold nanorods can have a particular absorption characteristic in the wavelength region from 750 nm to 1,100 nm depending on the aspect ratio. Therefore, in the case in which a particular site of a living body is stained with the gold nanorods, when the near infrared rays are radiated, the near infrared rays are absorbed ay that site, thereby the site can be identified. Therefore, with regard to a thick biomaterial which cannot be measured by a conventional method involving a suspension or a coloration of the biomaterial, it becomes possible to observe an optional portion colored by the gold nanorods.

Specifically, a living body is stained using the gold nanorods of the present invention coated with a compound having high biocompatibility, for example, polyethylene glycol, phospholipid, sugar chains or antibodies. The gold nanorods coated with polyethylene glycol or phospholipid is suitable for uniformly staining a living body without localizing at a particular organ or tissue. Especially, since polyethylene glycol is less subjected to a decomposition by the living body and is excellent in cell permeability, polyethylene glycol is suitable for a coating material for the biomarker. In the meantime, since the sugar chain or the antibody are accumulated in a specific organ or tissue, they are suitable for staining a specific organ or tissue. By using gold nanorods coated with this material, the biomaterial can be observed which could not be conventionally observed.

When the metal nanorods of the present invention are one-dimensionally arranged at high density and regularly, an interaction of a near-field light generated in a vicinity of nano-particles enables light transmission between the particles. Thereby, a nano-waveguide can be obtained which is suitable for a one-dimensional waveguide. For example, the nano-waveguide can be obtained by the following method: Firstly, the metal nanorods are one-dimensionally arranged using an atomic force microscope (AFM) or a scanning tunneling microscope (STM) as a manipulator. Next, luminous nano-particles (such as zinc oxide or CdTe) are fixed at an end of the one-dimensionally arranged metal nanorods, and an optical fiber sensor of the near-field microscope is positioned at an opposite end of the arrangement. By forming such as structure, a nano-waveguide can be obtained. The metal nanorods of the present invention are suitable for the material of this nano-waveguide.

EMBODIMENT

Preferred embodiments of the present invention are described below. However, the present invention is not limited to the following embodiments, and for example, components of these embodiments can be appropriately combined.

Here, in each embodiment, for measuring an absorption spectrum of a reaction solution, a cell having an optical path length of 1 mm was used.

Embodiment 1

(Synthesis of Gold Nanorods by Combination of Chemical Reduction Process and Light Irradiation Process)

A solution was prepared by adding 1.26 g of TDAB (tetradecylammonium bromide: compound II) to 3 ml of a CTAB (hexadecyltrimethylammonium bromide: surfactant (compound I)) solution having a concentration of 80 mM. 0.25 ml of a chlorauric acid solution having a concentration of 24 mM, 0.065 ml of acetone, 0.045 ml of cyclohexane and 31.5 µl of a silver nitrate solution having a concentration of 10 mM were added to that solution so as to obtain a reaction solution. 0.2 ml of an ascorbic acid (AS) solution having a concentration of 40 mM was added to this reaction solution so as to conduct a chemical reduction. Immediately after adding the AS solution, color of the reaction solution was changed from orange to clear. The clear solution was poured into a quartz cell having an optical path length of 1 cm, and was subjected to a light irradiation. For the light irradiation, an extra-high pressure mercury lamp (500 W) was used and most of the visible light was cut off using an ultraviolet transmission filter (Sigma, UTVAF-33U).

FIG. 1 shows an absorption spectrum of the reaction solution after the light irradiation for 15 minutes. As shown in the chart, the absorption spectrum having two absorption peaks, which were distinctive to the gold nanorods, were obtained. Furthermore, according to an observation by a transmission electron microscope (TEM), the generation of the gold nanorods was also confirmed. It was confirmed that the gold nanorods could be manufactured by the light irradiation of merely 15 minutes, which had the same concentration as that manufactured using the electrolytic method.

Embodiment 2

(Effect of Types of Compound II)

Figure 2:
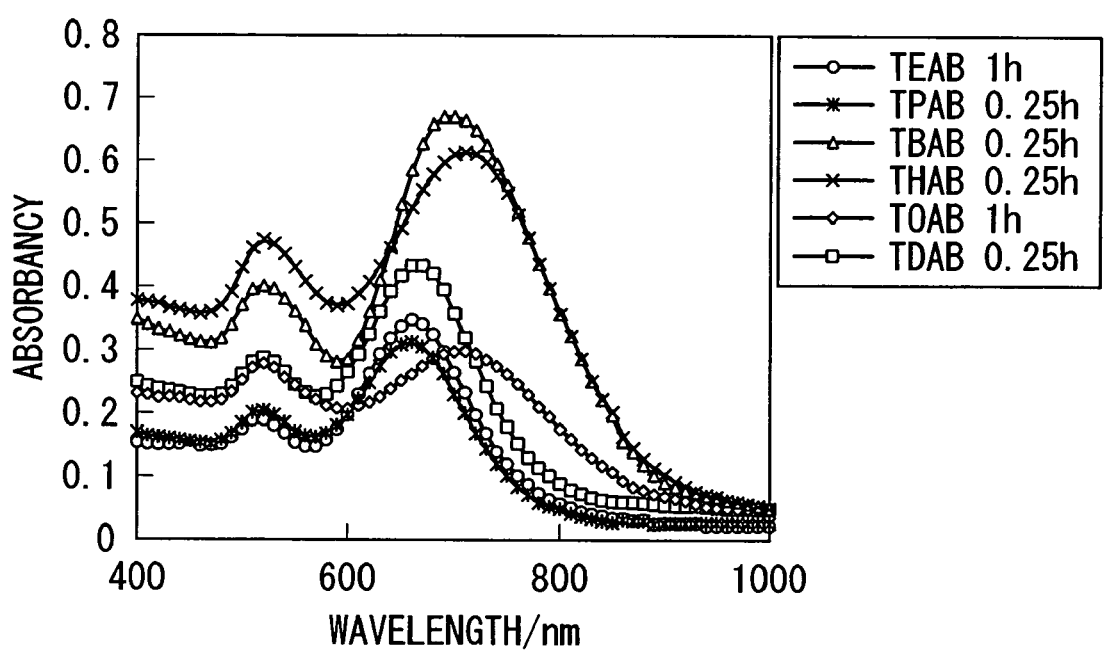
FIG. 2 is an absorption spectrum chart after light irradiation in Embodiment 2.

Reaction solutions were prepared in the same manner as Embodiment 1, and the chemical reduction and the light irradiation were performed. However, instead of TDAB, another compound II was added at the same molar equivalent as that of TDAB in Embodiment 1. The chemical reduction using ascorbic acid and the light irradiation were conducted under the same conditions as those in Embodiment 1. The compounds II used in the present embodiment were the following five types ("n" indicates the number of —$CH_2$— groups). Table 1 shows preparation conditions for the reaction solutions and light irradiation time until the change due to the light irradiation almost stopped. In addition, FIG. 2 shows the absorption spectra of the reaction solutions after the completion of the light irradiation. Here, a chart using TDAB was shown as a comparison.

(A) Tatraethylammonium bromide (TEAB: n=1)
(B) Tetra-n-propylammonium bromide (TPAB: n=2)
(C) Tetrabutylammonium bromide (TBAB: n=3)
(D) Tetra-n-hexylammonium bromide (THAB: n=5)
(E) Tetra-n-octylammonium bromide (TOAB: n=7)
(F) Tetradodecylammonium bromide (TDAB: n=11)

In any of cases in which one of the above-mentioned (A) to (F) was used, the absorption spectrum having two absorption peaks, which were distinctive to the gold nanorods, was obtained. Furthermore, according to the TEM observation, the generation of the gold nanorods in all of the solutions could be also confirmed. In the case in which TBAB, TOAB or THAB was used, a wavelength in which a longitudinal absorption band appeared was longer than that in the case in which TEAB, TPAB or TDAB was used; thereby it was confirmed that the gold nanorods having a longer major axis were generated. It could be confirmed that a chemical structure of the compound II affected a configuration of the gold nanorods.

TABLE 1

| | No. | | | | | |
|---|---|---|---|---|---|---|
| | 1 | 2 | 3 | 4 | 5 | 6 |
| Modifier (mg) | TDAB 1.26 | TOAB 0.89 | THAB 0.71 | TBAB 0.53 | TPAB 0.44 | TEAB 0.23 |
| Light irradiation time (min) | 15 | 60 | 15 | 15 | 15 | 60 |

Embodiment 3

(Effect of Addition of Compound II)

Figure 3:
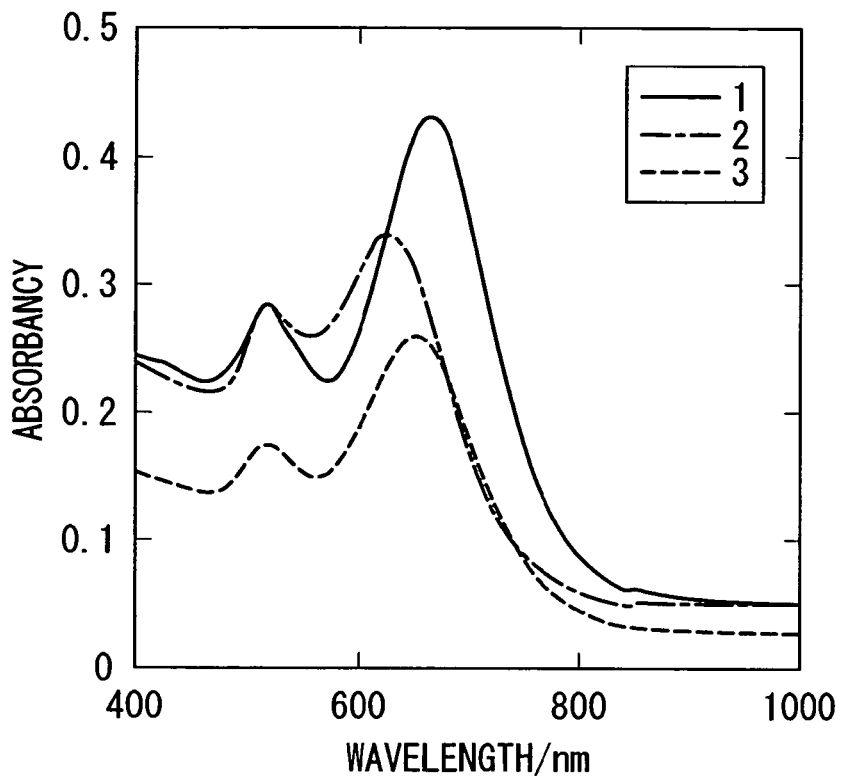
FIG. 3 is an absorption spectrum chart after light irradiation in Embodiment 3.

Reaction solutions were prepared in the same manner similar as Embodiment 1, and the chemical reduction and the light irradiation were conducted. However, a different quantity of TDAB was added to one of the reaction solutions. Table 2 shows the preparation conditions for the reaction solutions and the light irradiation time until the change due to the light irradiation almost stopped. FIG. 3 shows the absorption spectra of the reaction solutions after the completion of light irradiation. As shown in FIG. 3, in each case, the absorption spectrum having two absorption peaks, which were distinctive to the gold nanorods, was obtained. Furthermore, according to the TEM observation, it could be also confirmed that the gold nanorods were generated in all the solutions. In comparison with Embodiment 1, with regard to the sample (No. 2) in which an addition amount of TDAB was more than that of Embodiment 1, a peak of the longitudinal absorption obviously shifted to a shorter wavelength. In contrast, with regard to the sample (No. 3) in which this addition amount was less than that of Embodiment 1, there was hardly any change. It has become obvious that the effect of the compound II is limited.

TABLE 2

| | No | | |
|---|---|---|---|
| | 1 | 2 | 3 |
| TDAB (mg) | 1.26 | 2.52 | 0.63 |
| Light irradiation time (min) | 15 | 18 | 15 |

Embodiment 4

(Example Using Gold Salt Solution Containing Anionic Surfactant)

Figure 4:
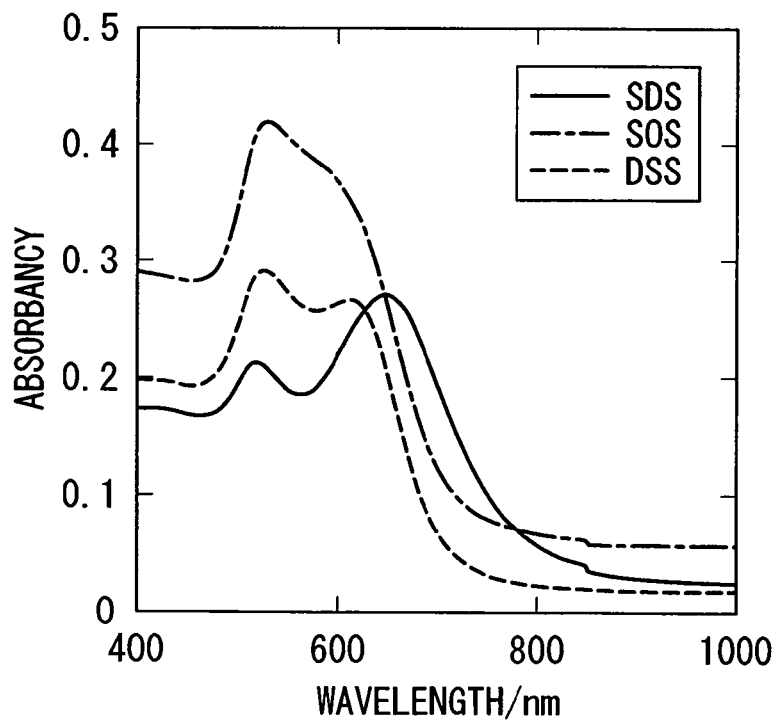
FIG. 4 is an absorption spectrum chart after light irradiation in Embodiment 4.

Reaction solutions were prepared in the same manner similar as Embodiment 1, and the chemical reduction and the light irradiation were conducted. However, instead of the compound II, anionic surfactants were each added to the reaction solutions, and solutions containing CTAB and the anionic surfactant were prepared. The anionic surfactants in use were as follows. Table 3 shows the preparation conditions for the reaction solutions and the light irradiation time until the change due to the light irradiation stopped. Furthermore, FIG. 4 shows the absorption spectra of the reaction solutions after the completion of the light irradiation.

(G) Sodium dodecylsulfate (SDS)
(H) Sodium octylsulfate (SOS)
(I) 1-decanesulfonic acid sodium salt (DSS)

With regard to the samples prepared by which SDS or DSS was added, the absorption spectrum having two absorption peaks, which were distinctive to rod-shaped particles, was obtained. Even in the sample prepared by which SOS was added, the two absorption peaks were slightly confirmed. Furthermore, according to the TEM observation, it could be also confirmed that the gold nanorods or gold nano-particles in a shape of a rectangular round were generated corresponding to the spectrum. it could be confirmed that the addition of the anionic surfactant to the reaction solution so as to form hydrophobic associations with the surfactant (compound I), could affect the generation of the gold nanorods.

TABLE 3

| | No | | |
|---|---|---|---|
| | 1 | 2 | 3 |
| Surfactant (mg) | SDS 0.22 | SOS 0.35 | DSS 0.09 |
| Light irradiation time (min.) | 15 | 20 | 30 |

Embodiment 5

(Example Using Gold Salt Solution not Containing Compound II but Containing Silver Salt)

Figure 5:
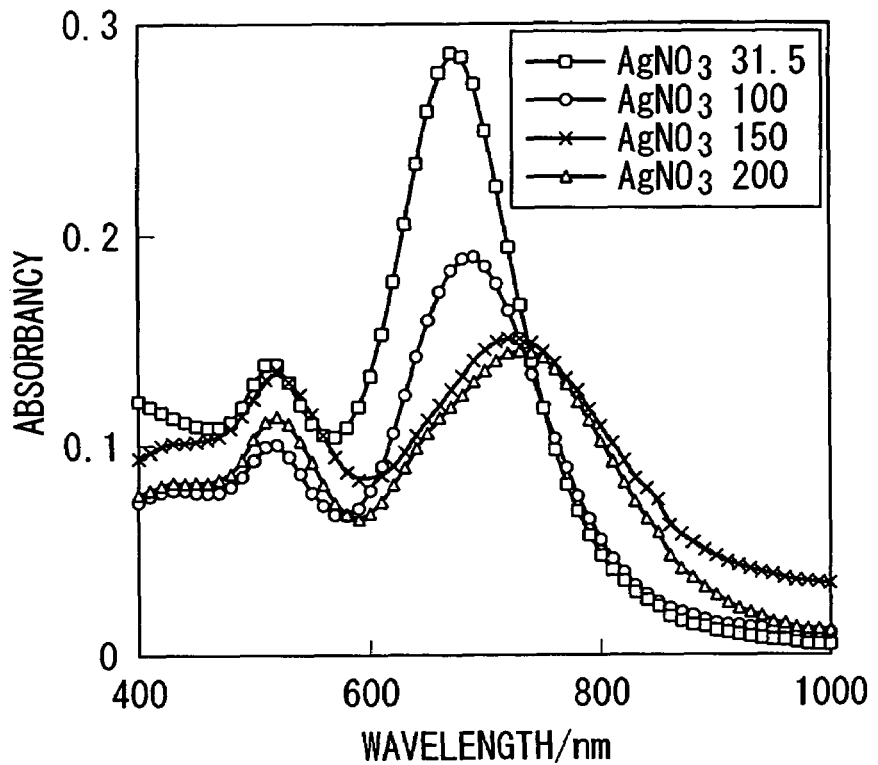
FIG. 5 is an absorption spectrum chart after light irradiation in Embodiment 5.

Reaction solutions were prepared in the same manner similar as Embodiment 1, and the chemical reduction and the light irradiation were conducted. However, the compound II was not added to the reaction solutions, and solutions which did not contain any other surfactant besides CTAB were prepared. 31.5 μl, 100 μl, 150 μl and 200 μl of silver nitrate solutions having a concentration of 10 mM were each added to one of these solutions, and the reaction solutions were prepared. Here, the chemical reduction by ascorbic acid and the light irradiation were conducted under the same conditions as those in Embodiment 1. Ultraviolet rays were radiated for 30 minutes. FIG. 5 shows the absorption spectra of the reaction solutions after the light irradiation.

As shown in FIG. 5, an absorption spectrum having two absorption peaks, which were distinctive to the gold nanorods, was obtained. Furthermore, according to the TEM observation, the generation of the gold nanorods in all solutions could be also confirmed. In addition, it was confirmed that as the silver amount was increased, the peak of the longitudinal absorption shifted to the longer wavelength. In other words, the increase of the addition amount of silver salt resulted in the generation of gold nanorods having longer length and greater size. However, when the addition amount of the silver nitrate was increased from 150 μl to 200 μl, the spectrum did not greatly change.

Embodiment 6

(Effect of CTAB Concentration and Effect of Compound II)

Figure 6:
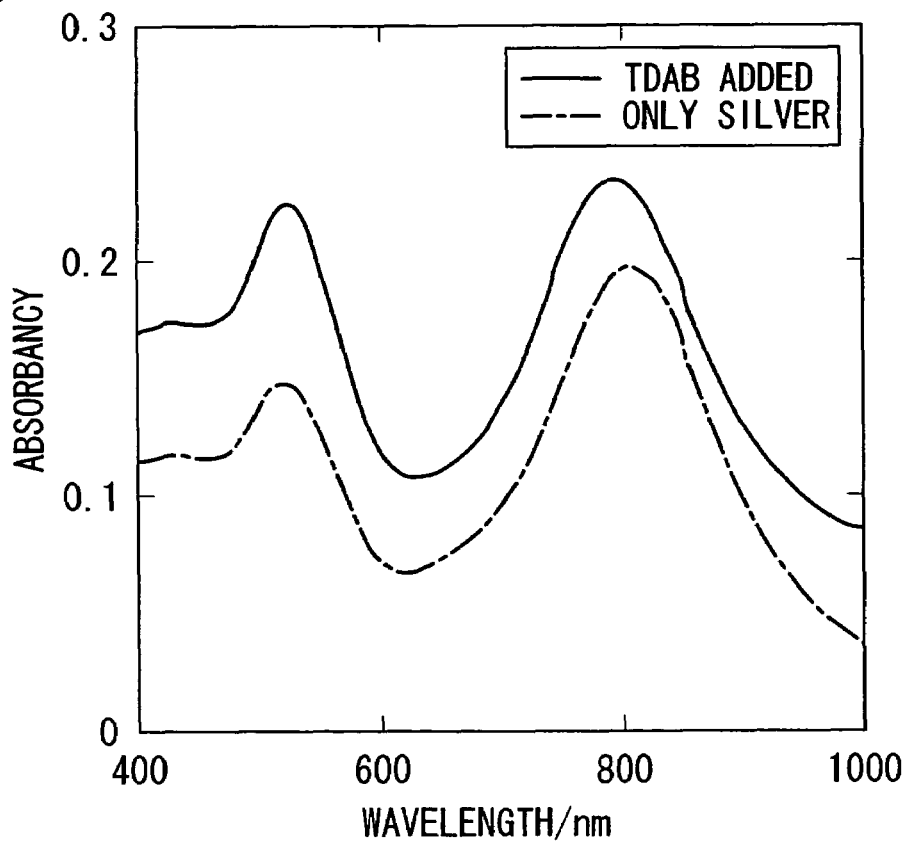
FIG. 6 is an absorption spectrum chart after light irradiation in Embodiment 6.

Reaction solutions were prepared in the same manner similar as Embodiment 1, and the chemical reduction and the light irradiation were conducted. However, a CTAB solution having a concentration of 160 mM was used. Furthermore, 200 μl of a silver nitrate solution having a concentration of 10 mM was added to the reaction solutions. In addition, a solution containing compound II (TDAB) (1.26 mg) and a solution not containing compound II were prepared, and the chemical reduction by ascorbic acid and the light irradiation for 15 minutes were conducted under the same conditions as those in Embodiment 1. FIG. 6 shows the absorption spectra of the reaction solutions after the light irradiation.

As shown in FIG. 6, under any condition, a spectrum having two absorption peaks, which were distinctive to the rod-shaped particles, was obtained. It could be confirmed that the addition of TDAB rather shortened the length of the gold nanorods. In comparison with the case of Embodiment 1 (FIG. 1), it could be confirmed that in any cases, the peak of the longitudinal absorption existed in a longer wavelength region. It could be confirmed that the absorption peak was shifted to a longer wavelength as the CTAB concentration was increased.

Embodiment 7

(Effect of the Optical Path Length of the Quartz Cell and Effect of the Irradiation Time)

Figure 7:
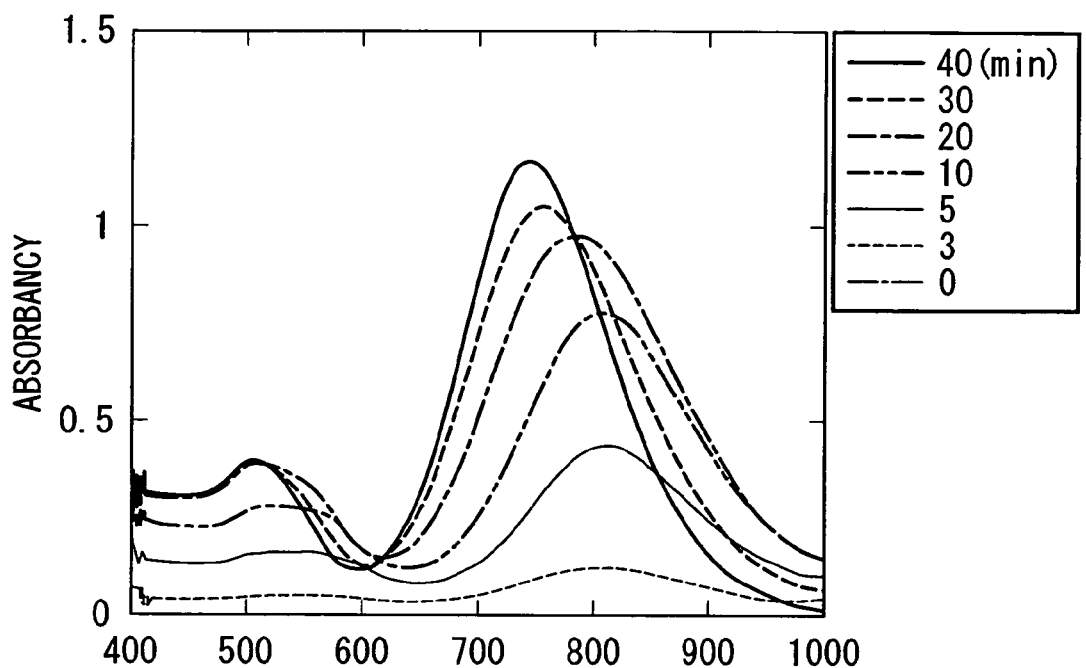
FIG. 7 is an absorption spectrum chart after light irradiation in Embodiment 7.

The reaction solutions were prepared in the same manner as Embodiment 1, and the chemical reduction and the light irradiation were conducted. However, addition amount of silver was 200 μl. The solution was poured into a quartz cell having an optical path length of 1 mm, and ultraviolet rays under the same condition as that in Embodiment 1 were radiated from a side of the cell, and at the same time, a change of the absorption spectrum over time was measured. For the spectrum measurement, a multi-channel spectroscope was used. FIG. 7 shows the changes of the absorption spectra of the reaction solutions caused by a difference of the light irradiation time.

As shown in FIG. 7, it was confirmed that as the light irradiation time increased up to approximately 6 minutes, a peak at a longer wavelength side shifted to a longer wavelength, that is, the major axis of the gold nanorods became longer. It was also confirmed that as the light irradiation time further increased, the peak shifted to a shorter wavelength. It was confirmed that the configuration of the gold nanorods could also be controlled by the irradiation time. Furthermore, in comparison with Embodiments 1 to 6, it was also confirmed that the peak intensity of a transverse absorption was remarkably small in samples prepared under the experimental conditions of the present embodiment. It was confirmed that because the optical path length of the cell used for the light irradiation was 1 mm (in Embodiments 1 to 6, the cell having the optical path length of 1 cm was used), the optical reaction due to the ultraviolet rays uniformly progressed, thereby uniform gold nanorods could be generated.

Embodiment 8

(Effect of Nitrogen Bubbling)

Figure 8:
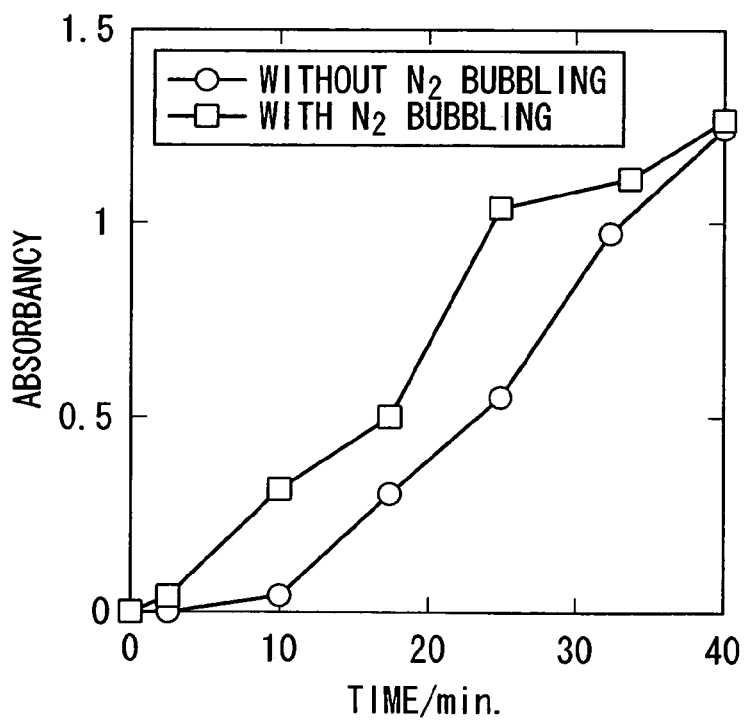
FIG. 8 is a chart in which the absorbancy of the absorption peaks in Embodiment 8 is plotted.

Reaction solutions were prepared in the same manner similar as Embodiment 7, and the chemical reduction and the light irradiation were conducted. The light irradiation was conducted in both of a condition in which nitrogen was introduced to the reaction solution so as to bubble the solution and a condition in which no nitrogen was introduced, and a comparison was made between the absorption spectrum of the solution which was subjected to the nitrogen bubbling and that of the solution which was not subjected. Here, measurements were conducted using a multi-channel spectroscope at the same time of the light irradiation. FIG. 8 shows a chart in which the absorbancies of the peaks of the longitudinal absorption were plotted relative to the light irradiation time. As shown in the chart, it was confirmed that, in the irradiation time of approximately 35 minutes or less, the absorbancies in the reaction solution in which the nitrogen bubbling was conducted and the dissolved oxygen in the solution was removed, were greater. In particular, the difference is prominent in the irradiation time of 25 minutes or shorter. Furthermore, it was confirmed that in the case in which a solution was subjected to an oxygen bubbling and a saturated oxygen was dissolved, the reaction due to the light irradiation was almost completely suppressed. It was confirmed that the dissolved oxygen in the reaction solution suppressed the generation of the gold nanorods due to the light irradiation. It was also confirmed that the removal of the dissolved oxygen was effective in order to increase the reaction rate.

Embodiment 9

(Example Left Stationary after the Light Irradiation)

Figure 9:
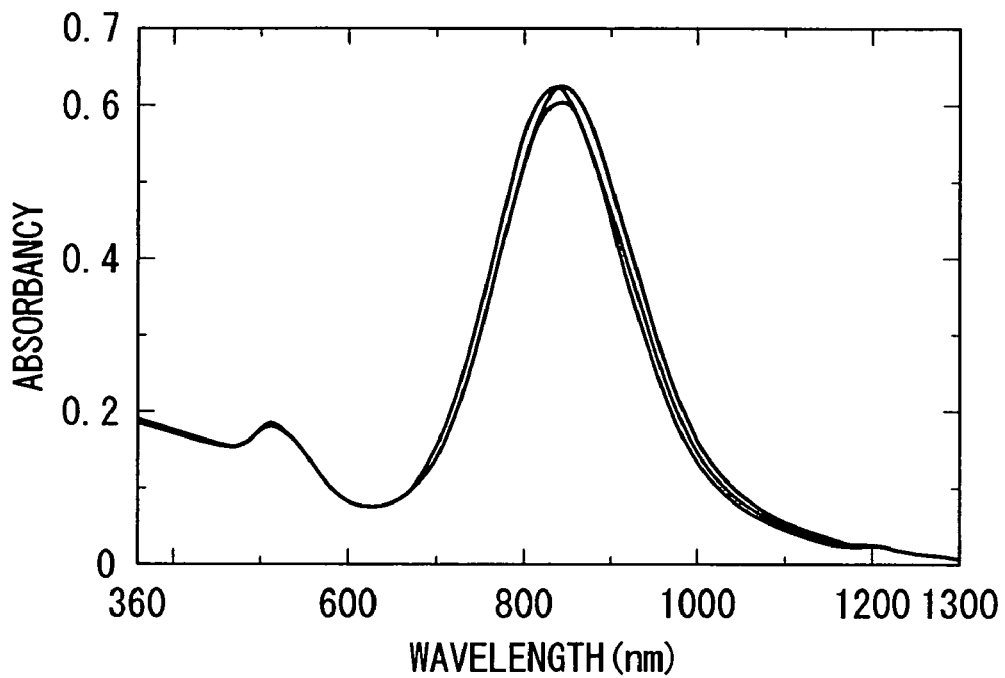
FIG. 9 is an absorption spectrum chart in the case of leaving the reaction solution stationary after light irradiation in Embodiment 9.
Figure 10:
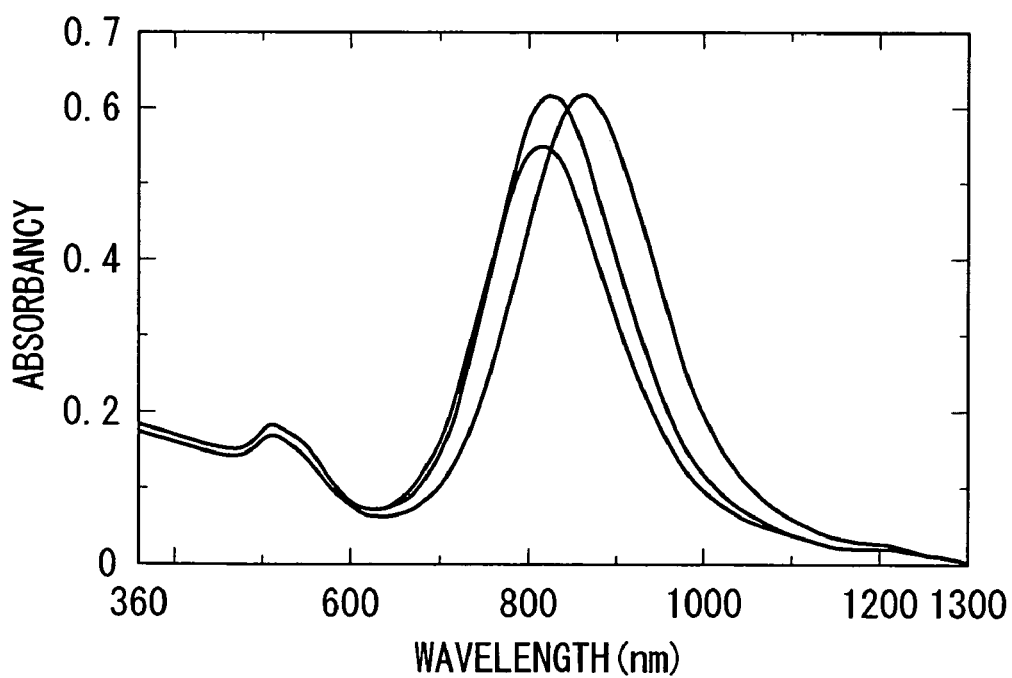
FIG. 10 is an absorption spectrum chart in the case of not leaving the reaction solution stationary after light irradiation in Embodiment 9.

Reaction solutions were prepared by adding 0.25 ml of a chlorauric acid solution having a concentration of 24 mM, 0.065 ml of acetone, 0.045 ml of cyclohexane and 20.0 ml of a silver nitrate solution having a concentration of 10 mM to 3 ml of a CTAB solution having a concentration of 480 mM. 0.2 ml of an ascorbic acid solution having a concentration of 40 mM was added to the reaction solution so as to conduct a chemical reduction, and then light was radiated into the solution. For the light irradiation, light of 10 mW/cm² was directly radiated into the reaction solution for 10 minutes. FIG. 9 shows one case in which after completion of the light irradiation into the reaction solution, the solution was left stationary for one hour, and then the solution was transferred to a storage container. FIG. 10 shows another case in which the solution was transferred immediately after the irradiation without leaving stationary.

In the example shown in FIG. 9 in which the reaction solution was left stationary after the light irradiation, in the case of synthesizing three times, substantially uniform spectra were obtained relative to the peak position and the peak intensity of the absorption wavelength. In contrast, in the example shown in FIG. 10 in which the reaction solution was immediately transferred to the storage container after the light irradiation, in the case of synthesizing three times, the peak position and the peak intensity of the absorption wavelength shifted, therefore the reproducibility was low.

Embodiment 10

Figure 11:
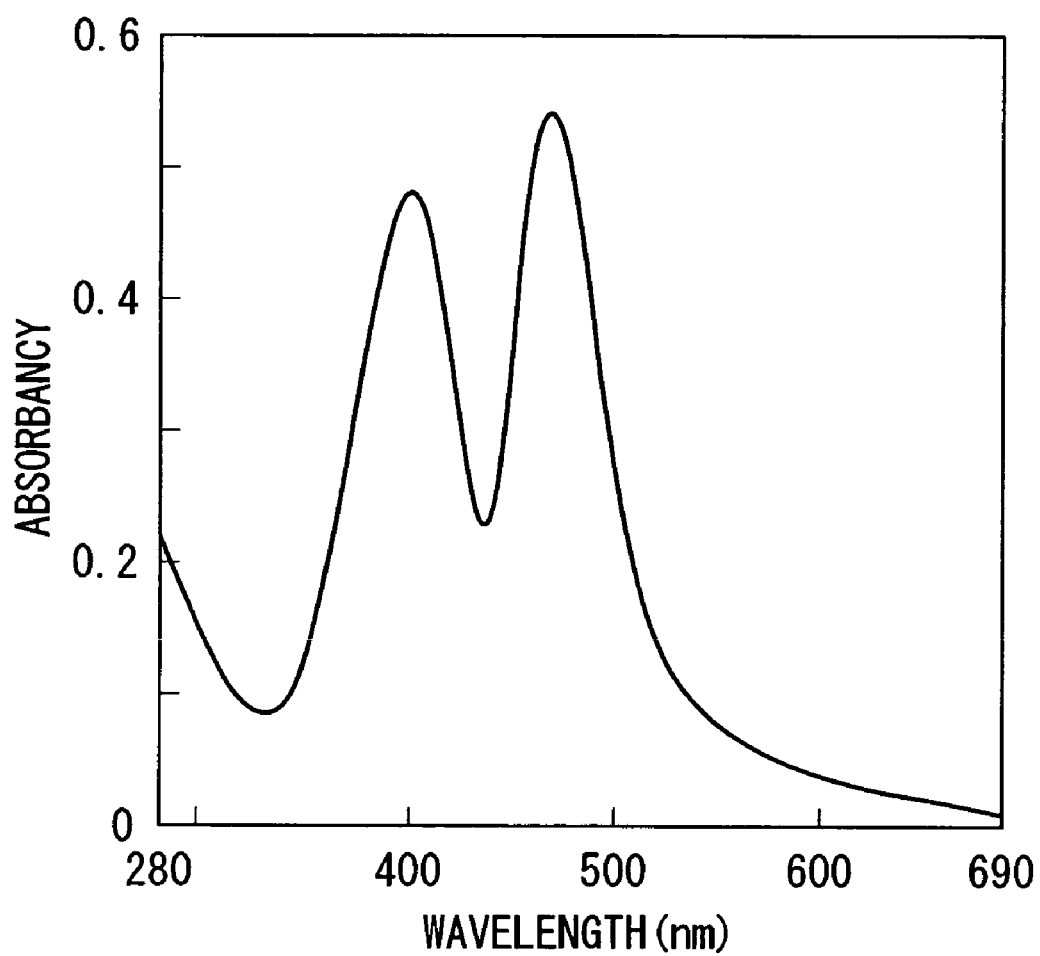
FIG. 11 is an absorption spectrum chart in Embodiment 10.

(Example of Silver Nanorods)
A solution was prepared by adding 1.26 mg of TDAB (compound II) to 3 ml of a CTAB solution having a concentration of 480 mM. 0.25 ml of a silver nitrate solution having a concentration of 24 mM, 0.065 ml of acetone and 0.045 ml of cyclohexane were added to this solution so as to obtain a reaction solution. After 0.2 ml of an ascorbic acid solution having a concentration of 40 mM was added to this reaction solution so aso to conduct a chemical reduction, and then light was radiated into this chemically reduced solution. For the light irradiation, light of 10 mW/cm² was directly radiated into the reaction solution for 10 minutes. After the irradiation into the reaction solution, the solution was left stationary in its existent state for one hour and then transferred to a storage container. FIG. 11 shows the absorption spectrum of the reaction solution after its being left stationary. As shown in the chart, the spectrum was obtained which had a peak (at or in a vicinity of 400 nm) resulting from spherical silver fine particles along with a peak (at or in a vicinity of 470 nm) resulting from rod-shaped particles (silver nanorods).

Embodiment 11

(Dependency of Generation of Gold Nanorods on Irradiation Wavelength)
A reaction solution was prepared by adding 0.25 ml of a chlorauric acid solution having a concentration of 24 mM, 0.065 ml of acetone, 0.045 ml of cyclohexane and 200 µl of a silver nitrate solution having a concentration of 10 mM to 3 ml of a CTAB (hexadecyltrimethylammonium bromide) solution having a concentration of 80 mM. 0.2 ml of an ascorbic acid (AS) solution having a concentration of 40 mM to this reaction solution so as to conduct a chemical reduction. Immediately after the AS solution was added, color of the reaction solution changed from orange to clear. The clear solution was poured into a quartz cell having an optical path length of 1 mm, and ultraviolet rays from an extra-high pressure mercury lamp (500 W), which were made to be monochromatic by a spectroscope (JOBIN YVON, HIOUV), were radiated for 15 minutes. Wavelengths of the ultraviolet rays were 280 nm (2.1 mW/cm²), 289 nm (2.2 mW/cm²), 297 nm (4.7 mW/cm²), 303 nm (7.47 mW/cm²), 315 nm (8.3 mW/cm²) and 365 nm (11.0 mW/cm²), respectively.

Figure 12:
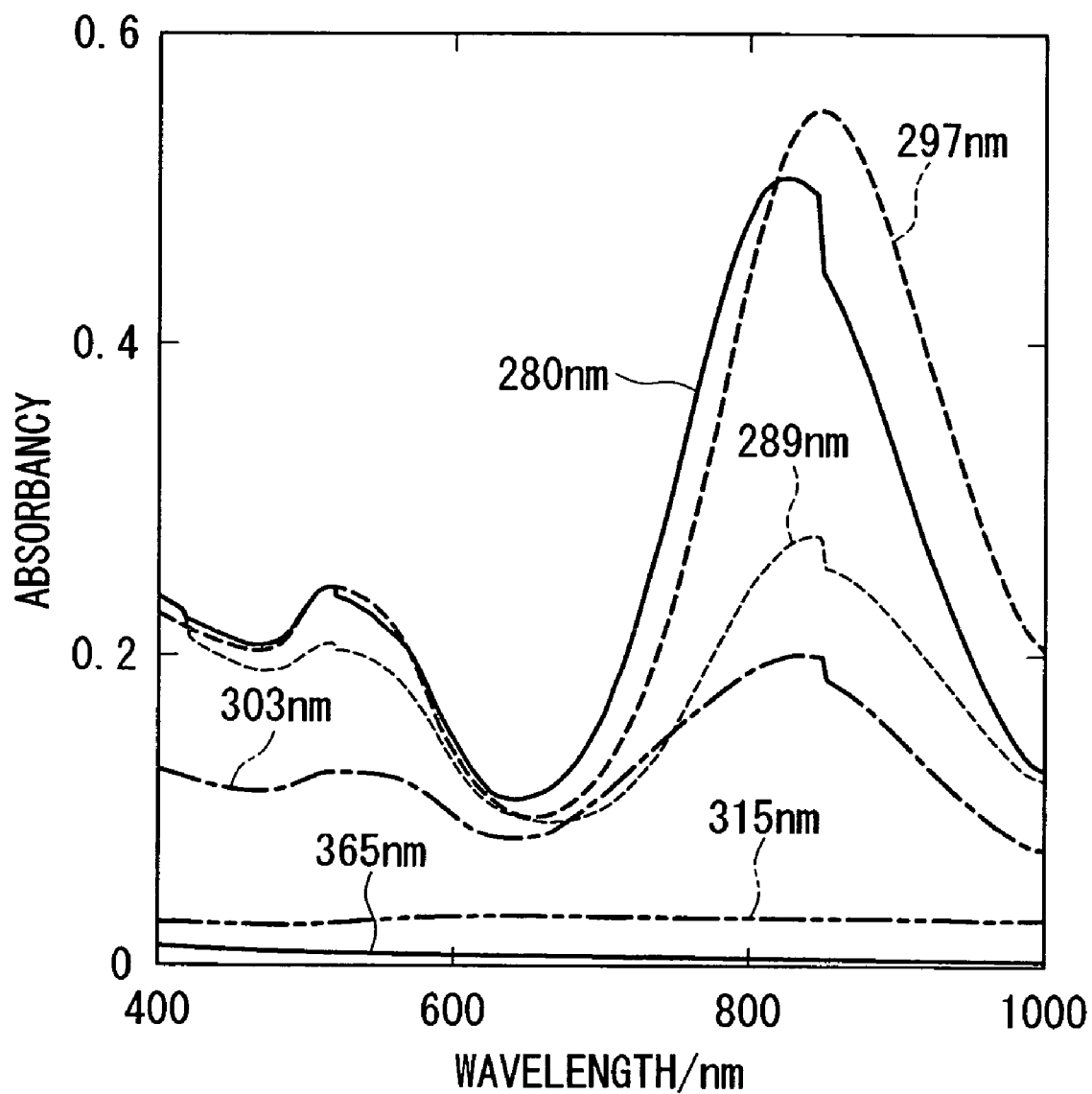
FIG. 12 is a chart showing changes in an absorption spectrum at irradiation wavelengths in Embodiment 11.
Figure 13:
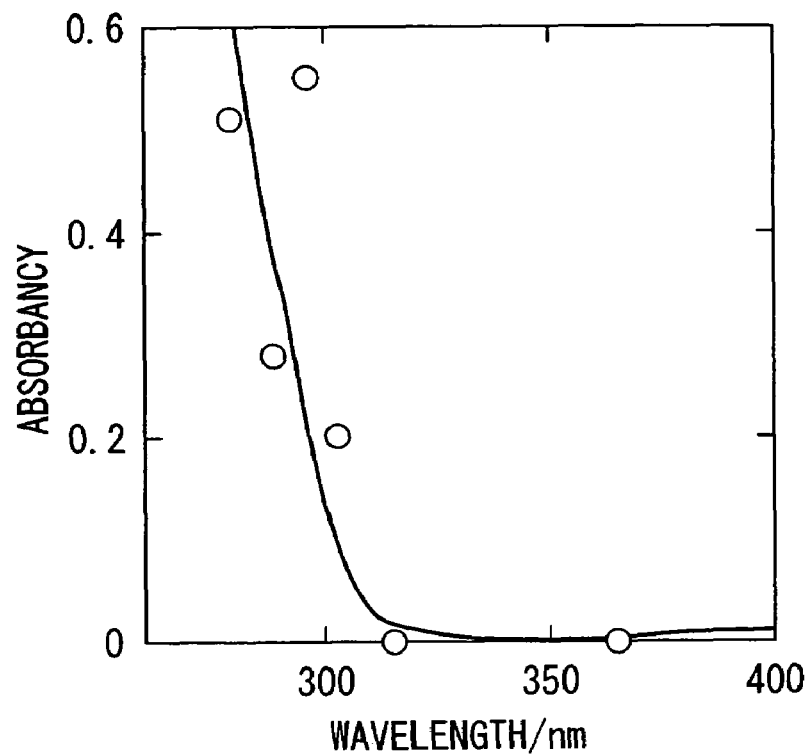
FIG. 13 is an action spectrum chart for the generation of metal nanorods in Embodiment 11.

The absorption spectra of the reaction solutions after the light irradiation were each measured. FIG. 12 shows the absorption spectra after the ultraviolet irradiation which were standardized such that irradiation energy intensities be 6.1 mW. As shown in the chart, it was confirmed that the gold nanorods could be generated by the ultraviolet irradiation of which the wave length was less than 315 nm. In addition, FIG. 13 shows a chart in which the absorption peaks resulted from the major axis of the gold nanorods were plotted relative to the wavelength of the radiated ultraviolet rays (action spectrum). As shown in the chart, it was confirmed that a generation efficiency of the gold nanorods increased dramatically from a vicinity of 310 nm.

Embodiment 12

Figure 14:
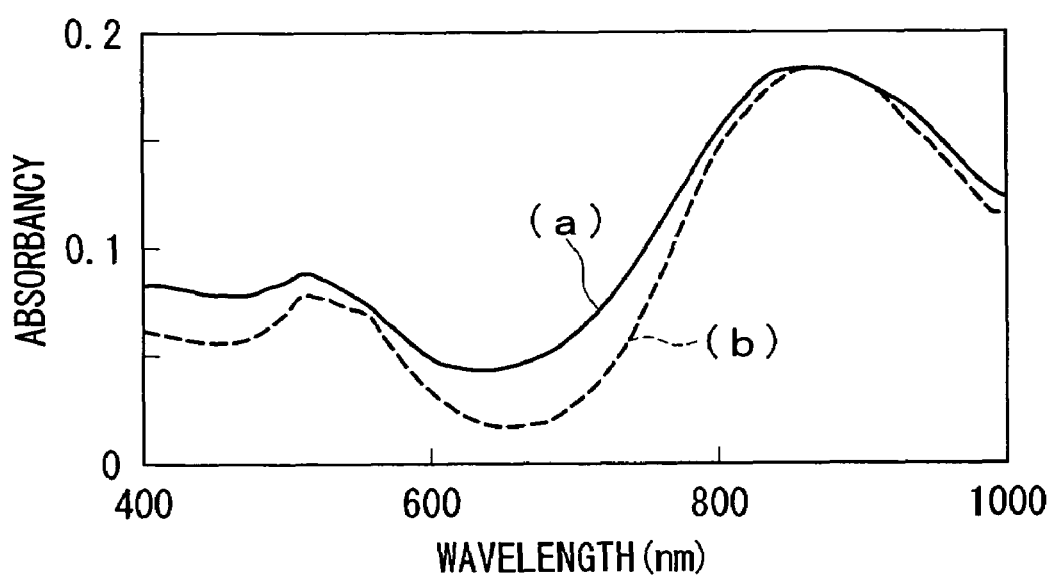
FIG. 14 is an absorption spectrum chart in Embodiment 12.

4 ml of the reaction solution similar to that in Embodiment 1 in which ascorbic acid was added, was poured into a quartz cell (1 mm of optical path length), and then ultraviolet rays (using ultraviolet transmission filter: Sigma UTVAF-33U, 8 mW) from an extra-high pressure mercury lamp were radiated for 10 minutes. 200 µl was fractionated from the solution in which the ultraviolet rays was radiated, and then was used as a seed solution, which was mixed into a reaction solution in which no light was radiated (a solution with the same composition as that in which the light was radiated, ascorbic acid added), and the mixed solution was left stationary in a dark place for 30 minutes. A change between the optical absorption spectrum of the seed solution in which the ultraviolet rays were radiated and that of the mixed solution after leaving stationary was measured. The results were shown in FIG. 14.

(a) in the chart was the absorption spectrum of the seed solution into which the ultraviolet rays were radiated, and it had a great absorption peak at or in a vicinity of 850 nm resulting form the gold nanorods generated by the ultraviolet irradiation. (b) in the chart was the absorption spectrum of the mixed solution after being left stationary in a dark place, and it had an absorption peak in a similar wavelength region as that of the seed solution. In addition, the absorption peak had absorbancy which was substantially the same as that of the seed solution. In other words, it was confirmed that, in the case in which 200 µl of the seed solution was added to the non-radiated reaction solution (mother solution) having a volume of 20 times as large as the seed solution and this solution was left stationary in a dark place for 30 minutes, the gold nanorods were generated of which concentration was increased to be similar to that of the seed solution.

Embodiment 13

Figure 15:
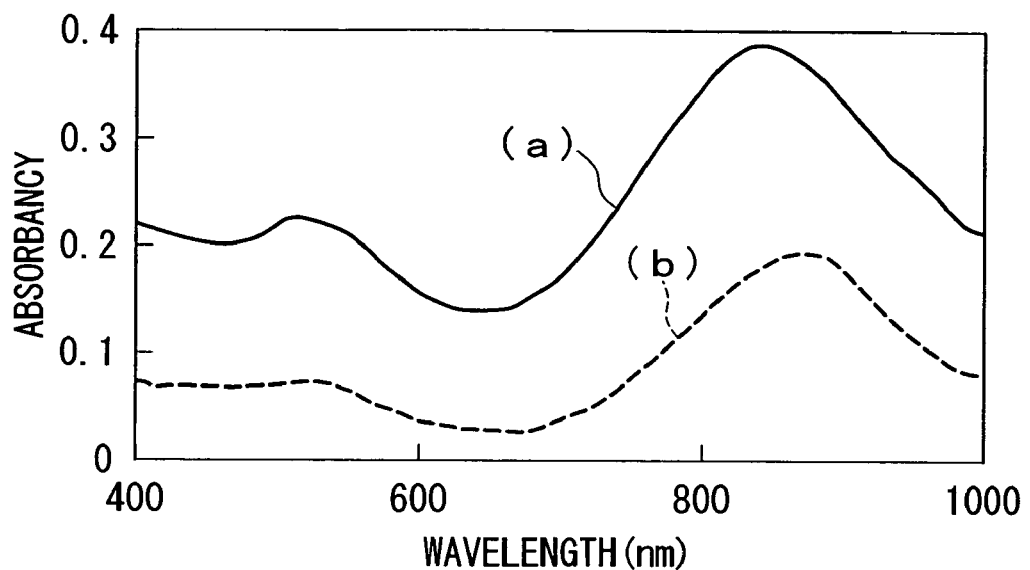
FIG. 15 is an absorption spectrum chart in Embodiment 13.

Light was radiated into a reaction solution in which the CTAB concentration was 80 mM (the same composition as that in Embodiment 12), and 200 µl was fractionated from this reaction solution so as to be used as a seed solution. In the meantime, a reaction solution in which the CTAB concentration was 480 mM (other compositions were same as those of the light-radiated solution) was used as a mother solution. The above-mentioned seed solution was mixed into this mother solution and the mixed solution was left stationary in a dark place for 30 minutes. The optical absorption spectra of the seed solution and the mixed solution after being left stationary were measured. The results are shown in FIG. 15.

(a) in the chart was the absorption spectrum of the seed solution into which the ultraviolet rays were radiated, and (b) in the chart was the absorption spectrum of the mixed solution after being left stationary in a dark place. An absorption peak in the absorption spectrum of (b) shifted to a longer wavelength than that in the absorption spectrum of (a); therefore, it was confirmed that gold nanorods having a greater aspect ratio could be manufactured using the mother solution having high CTAB concentration.

Embodiment 14

Figure 16:
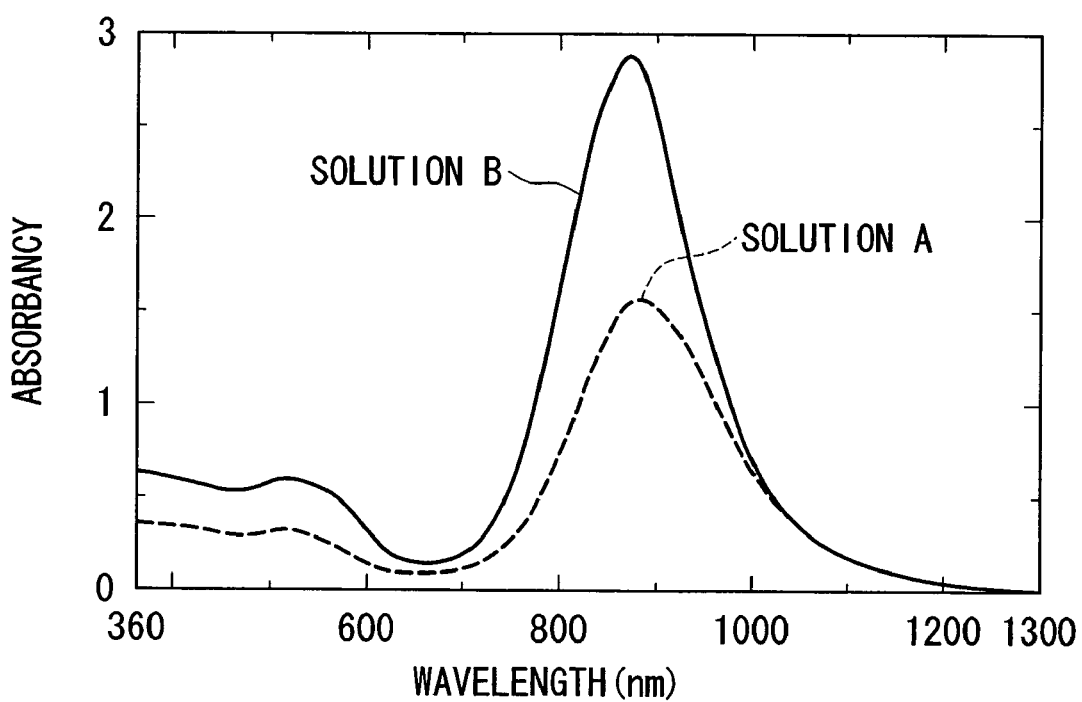
FIG. 16 is an absorption spectrum chart in Embodiment 14.

A reaction solution was prepared by adding 34 ml of a chlorauric acid solution having a concentration of 240 mM, 6 ml of acetone, 1 ml of cyclohexane and 25 ml of a silver nitrate solution having a concentration of 10 mM to 400 ml of a CTAB (hexadecyl trimethyl ammonium bromide) solution having a concentration of 500 mM. 33 ml of an ascorbic acid solution having a concentration of 40 mM was added to this reaction solution so as to conduct a chemical reduction. Immediately after the ascorbic acid solution was added, color of the reaction solution was changed from orange to clear. Ultraviolet rays from a high pressure mercury lamp were directly radiated from an upper side of the clear solution for 5 minutes (solution A). Furthermore, 25 ml of a chlorauric acid solution having a concentration of 24 mM and 25 ml of an ascorbic acid solution having a concentration of 40 mM were deliver by drops at a rate of 50 ml/hr into the solution A immediately after the light irradiation so as to obtain a mixed solution B. This light-radiated solution A and the mixed solution B were diluted 10 times (volume ratio) with water, respectively so as to obtain absorption spectrum measurement sample solutions. FIG. 16 shows the absorption spectra of these solutions.

As shown in the chart, the maximum absorption wavelength of the solution A was 880 nm and the absorbency was 1.6, and the maximum absorption wavelength of the solution B was 867 nm and the absorbency was 2.9. It was confirmed that in the case in which the non-radiated chlorauric acid solution and the reducing agent were mixed into the light-radiated solution A and the mixed solution was left stationary in a dark place, the gold nanorods could be manufactured catalytically while the solution was left stationary without radiating light.

INDUSTRIAL APPLICABILITY

According to the manufacturing method of the present invention, metal nanorods can be manufactured quickly and easily. Furthermore, a generation ratio of spherical metal nano-particles, which are by-products, is small; therefore, any fractionation and purification after the reaction are unnecessary. In addition, a configuration of the metal nanorods is easily controlled; thereby metal nanorods can be manufactured of which spectral characteristics in a wide wavelength region from the visible light to the near-infrared ray are controlled. Therefore, it is suitable for an industrial manufacturing.

The invention claimed is

1. A method for manufacturing gold nanorods, the method comprising:
    a step of chemically reducing an auric salt solution containing a surfactant by addition of a reducing agent;
    a step of radiating ultraviolet light into the chemically reduced solution for a period of 5 to 15 minutes so as to generate seed gold nano-particles in the shape of a rod, and
    a step of growing gold nanorods from the seed gold nano-particles, by leaving the seed solution stationary for 30 to 60 minutes in a place where the ultraviolet light is turned off.

2. The method for manufacturing gold nanorods according to claim 1, wherein ascorbic acid, citric acid or its salt, hydroxylamine hydrochloride, a hydrazine compound, succinic acid or its salt, or amines is used as the reducing agent.

3. The method for manufacturing gold nanorods according to claim 1, wherein a quaternary ammonium salt expressed by the following expression [I] is used as the surfactant $$CH_3(CH_2)_n N^+(CH_3)_3 Br^- \text{ (n=integer of 1 to 15)} \qquad [I].$$

4. The method for manufacturing gold nanorods according to claim 1, wherein the ultraviolet light is radiated into the auric salt solution in the presence of a substance which accelerates a major axis growth of the metal nanorods.

5. The method for manufacturing gold nanorods according to claim 4, wherein at least one of a quaternary ammonium salt expressed by the following expression, an anionic surfactant, and a silver salt is used as the substance which accelerates the major axis growth of the metal nanorods $$(CH_3(CH_2)_n)_4 N^+(CH_3)_3 Br^- \text{(n=integer of 1 to 15)} \qquad [II].$$

6. The method for manufacturing gold nanorods according to claim 1, wherein the auric salt solution further comprises ketones.

7. The method for manufacturing gold nanorods according to claim 1, wherein the auric salt solution further comprises a chain hydrocarbon or a ring hydrocarbon.

8. The method for manufacturing gold nanorods according to claim 1, wherein a configuration of the gold nanorods is controlled by adjusting one or more of the following: the type of the surfactant, the amount of surfactant added, the amount of the substance which accelerates the major axis growth of the gold nanorods, the light irradiation intensity, and the light irradiation time.

9. The method for manufacturing gold nanorods according to claim 4, wherein a configuration of the gold nanorods is controlled by adjusting one or more of the following: the type of the surfactant, the amount of surfactant added, the amount of the substance which accelerates the major axis growth of the gold nanorods, the light irradiation intensity, and the light irradiation time.

10. The method for manufacturing gold nanorods according to claim 1, wherein the step of radiating ultraviolet light uses ultraviolet rays having a wavelength of less than 315 nm.

11. The method for manufacturing gold nanorods according to claim 1, wherein a reaction container having an optical path length a 1 cm or less is used to control the configuration of the generating metal nanorods to be uniform.

12. The method for manufacturing gold nanorods according to claim 1, wherein dissolved oxygen is removed in a reaction solution so as to accelerate photoreaction.

* * * * *